(12) United States Patent
Kasatani

(10) Patent No.: US 6,492,714 B1
(45) Date of Patent: Dec. 10, 2002

(54) SEMICONDUCTOR DEVICE AND SEMICONDUCTOR MODULE

(75) Inventor: Yasushi Kasatani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/604,658

(22) Filed: Jun. 27, 2000

(30) Foreign Application Priority Data

Jan. 12, 2000 (JP) .................................. 2000-003417

(51) Int. Cl.[7] .............................................. H01L 23/02
(52) U.S. Cl. .................... 257/678; 257/666; 257/773; 257/778; 257/787
(58) Field of Search ............................... 257/693, 700, 257/686, 684, 666, 667, 668, 691, 773, 778, 787, 678

(56) References Cited

U.S. PATENT DOCUMENTS

| 5,744,862 A | 4/1998 | Ishii | 257/693 |
| 6,013,946 A | * 1/2000 | Lee | 257/684 |
| 6,166,443 A | * 12/2000 | Inaba | 257/777 |

FOREIGN PATENT DOCUMENTS

| JP | 405048000 A | * 2/1993 |
| JP | 9-121017 | 5/1997 |
| JP | 11-111914 | 4/1999 |

* cited by examiner

Primary Examiner—Olik Chaudhuri
Assistant Examiner—Nathan W. Ha
(74) Attorney, Agent, or Firm—Leydig, Voit & Mayer, Ltd.

(57) ABSTRACT

A pair of IC packages are placed in an opening of a substrate, and have straight leads laterally extending. IC package mounting lands correspondingly connected to the straight leads are arranged on upper and lower faces of a substrate. External connection lands serving as external connection terminals are disposed on extended lines along which the straight leads are drawn out, and correspondingly connected to the straight leads. The external connection lands are configured by: first-group external connection lands arranged along the side of integrated circuit packages; and second-group external connection lands arranged outside the first-group external connection lands. The first-group external connection lands and the second-group external connection lands are arranged in a staggered pattern.

7 Claims, 8 Drawing Sheets

PRIOR ART UPPER FACE

PRIOR ART LOWER FACE

SEMICONDUCTOR DEVICE AND SEMICONDUCTOR MODULE

BACKGROUND OF THE INVENTION

The present invention relates to a semiconductor device and a semiconductor module which are thin and can be mounted at high density, and particularly to a semiconductor device and a semiconductor module in which heat cycle resistance can be improved and short circuits can be prevented from occurring between solder bumps.

FIG. 10 is a plan view showing the configuration of a semiconductor device of the conventional art which is disclosed in, for example, Unexamined Japanese Patent Application No. Hei 9-321218, and FIG. 11 is a side view of FIG. 10. Referring to FIGS. 10 and 11, IC package mounting lands 13 are arranged on upper and lower faces of a substrate 11. Furthermore, external connection lands 14 serving as external connection terminals are arranged on the upper and lower faces of the substrate 11 and outside the IC package mounting lands 13, so as to respectively correspond to the IC package mounting lands 13. In the external connection lands 14 and the IC package mounting lands 13, each corresponding pair of lands is electrically connected via a wiring 15 on the substrate 11. With respect to the external connection lands 14, each vertically corresponding pair of lands which are respectively disposed on the upper and lower faces of the substrate 11 are electrically connected to each other via, for example, a conductor in a through hole.

In one of the faces of the substrate 11 (in FIG. 11, the lower face), solder bumps 16 for external connection are located on the external connection lands 14, respectively. An IC package 17 comprises a package body 18, and straight leads 19 which project straightly and laterally from the right and left side faces of the body 18. The straight leads 19 are fixed onto the corresponding IC package mounting lands 13 and electrically connected thereto, and supported by the substrate 11. In this way, a semiconductor device 24 is configured.

The semiconductor device 24 is configured in the following procedure. First, an IC package 17 is positioned on the upper face of the substrate 11, and the straight leads 19 are soldered to the IC package mounting lands 13 using a reflow technique. Next, the substrate 11 is turned over. Thereafter, another IC package 17 is similarly soldered to the lower face of the substrate 11, and the solder bumps 16 are soldered to the external connection lands 14.

Next, the configuration of a semiconductor module will be described. FIG. 12 is a side view showing the configuration of a semiconductor module of the conventional art in which the semiconductor device of FIGS. 10 and 11 is soldered to a mother board. Referring to FIG. 12, lands 21 for mounting the semiconductor device 24 are disposed on the upper face of a mother board 20. Usually, there are larger dimensional margins around the lands 21 as compared with the case of the external connection lands 14, and hence the lands 21 are larger in sectional area than the external connection lands 14. The semiconductor device 24 is fixed onto the lands 21 via the solder bumps 16 so as to accomplish electrical connections. In this way, a semiconductor module 25 is configured.

The semiconductor module 25 is connected and fixed to the mother board in the following procedure. First, the semiconductor device 24 is positioned on the upper face of the mother board 20. At this time, solder paste is previously supplied to portions where the solder bumps 16 are to abut against the lands 21, respectively. Thereafter, the solder paste and the solder bumps 16 are melted, so that the substrate 11 and the mother board 20 are connected and fixed to each other.

Next, in order to check the thermal fatigue life of the semiconductor module 25, a temperature cycle test in which a temperature change between, for example, −40 and 125° C. is imposed every 30 minutes is performed on the completed semiconductor module 25. FIG. 13 is a diagram showing a section where the semiconductor devices 24 and the mother board 20 which have undergone the temperature cyclic test are bonded to each other via the solder bumps 16 and the lands 21.

Referring to FIG. 13, when the semiconductor devices 24 are to be soldered to the mother board 20, the semiconductor device 24 which is first bonded is subjected to the reflow process while being downward directed, and therefore the solder bumps 16 are elongated by the weight of the semiconductor device 24. The semiconductor device 24 which is next bonded is subjected to the reflow process while being upward directed, and therefore the solder bumps 16 are compressed by their own weight.

This phenomenon causes a short circuit between the solder bumps 16 as described below. When solder paste is applied to the connection lands 21 on the upper and lower faces of the mother board 20 by using a solder print mask (not shown) having openings of the strictly same dimension, and the solder bumps 16 are bonded to the lands, the upper solder bumps 16 are pressed to expand together with the solder paste beyond the predetermined bonding portions as shown in FIG. 13. As a result, when the reflow process is performed, a short circuit may occur between adjacent solder bumps 16.

During the reflow process, the lower solder bumps 16 are elongated by the weight of the semiconductor device 24 and the sectional area of the bonding portions is reduced. As a result, when a temperature cyclic test is thereafter performed, a crack due to thermal fatigue is formed in the solder bonding portions, thereby causing the portions to be broken. Such breakage due to thermal fatigue easily occurs in bonding interfaces between the external connection lands 14 which are smaller in sectional area than the lands 21, and the solder bumps 16. This is related to the moment of inertia of the area of the bonding portion section in each bonding interface, i.e., the diameter of the bonding portion section in each bonding interface. Consequently, breakage may occur in a part of a small sectional area of the bonding portion section.

On the semiconductor module 25, mounted are elements which have different coefficients of thermal expansion, namely, the mother board 20, the substrate 11, the IC packages 17, and circuit components. Therefore, temperature changes occurring during the operation of a final product or a temperature cyclic test causes the solder bonding portions to be thermally deformed. The degree of the thermal deformation is proportional to the difference of the coefficients of thermal expansion, the distance between the solder bonding portions, and the temperature difference. Therefore, the greatest thermal deformation is produced in the solder bonding portions in the external connection lands 14 corresponding to the IC package mounting lands 13 which are respectively positioned at the ends and have the longest length of solder fixation. When breakage occurs, the end solder bonding portions are broken early.

In order to prevent cracks due to thermal fatigue from being produced in the solder bonding portions to break the portions, or breakage due to thermal deformation from occurring in the solder bonding portions, it may be contemplated that the diameter of the solder bumps 16 is increased. The reason why the diameter of the solder bumps 16 is increased will be described. Each solder bump 16 is approximated by a columnar model having a diameter D, and a load which can be held is estimated. When a load W is applied to the center line of the column, a stress $\sigma = 4 \times W/(\pi \times D \times D)$ is produced in any section over the whole length of the column. When the allowable stress of the solder at the temperature of the reflow process, for example, about 200° C. is indicated by $\sigma a$, the allowable load W of the solder columns (the solder bumps 16) can be obtained as $W = \sigma a \times \pi \times D \times D/4$. From this expression, it will be seen that the load W which can be held by a single solder column is proportional to the square of the diameter D of a bonding interface between each of the solder bumps 16 and the land 14 or 21. In order to increase the supportable load, therefore, the diameter D of the solder bumps 16 must be enlarged.

In the semiconductor device and the semiconductor module of the conventional art which have been described above, the external connection lands 14 corresponding to the IC package mounting lands 13 which are connected to the straight leads 19 of the semiconductor device 24 are disposed in one row and with a regular pitch. On the other hand, the diameter of the solder bumps 16 which are connected to the external connection lands 14 must be held to a minimum value in order to ensure the insulation distance, thereby preventing a short circuit from occurring between the solder bumps 16. Therefore, the diameter is restricted by the pitch and cannot be enlarged. Even when the external connection lands 14 and dummy lands 14a are arranged as shown in FIGS. 14A and 14B, the diameter of the solder bumps 16 is similarly restricted by the pitches of the lands and cannot be enlarged.

As described above, the diameter of the solder bumps 16 cannot be enlarged. Consequently, there arise problems in that breakage due to thermal fatigue cannot be prevented from being produced in the solder bonding portions between the solder bumps 16 and the lands 14 and 21, and also that breakage due to thermal deformation cannot be prevented from occurring in the solder bonding portions.

When the diameter of the solder bumps 16 is enlarged in order to prevent the solder bonding portions from being broken, there arises another problem in that a short circuit occurs between the solder bumps 16.

In order to prevent the solder bonding portions which, during the reflow process, are elongated by the weight of the downward-directed semiconductor device 24 mounted on the semiconductor module 25 to reduce the sectional areas of the bonding portions, from being cracked by thermal fatigue and broken, the package body 18 and the mother board 20 may be bonded together by an adhesive agent. However, this countermeasure has problems in that a bonding step is additionally required, and that the production cost is high.

SUMMARY OF THE INVENTION

The invention has been conducted in order to solve the above-discussed problems. It is an object of the invention to provide a semiconductor device and a semiconductor module in which breakage due to thermal fatigue is prevented from occurring in solder bonding portions between solder bumps and lands, or breakage due to thermal deformation is prevented from occurring in the solder bonding portions.

It is another object of the invention to provide a semiconductor device and a semiconductor module in which, even when the diameter of semiconductor bumps is enlarged so as to prevent solder bonding portions from being broken, it is possible to prevent a short circuit from occurring between the solder bumps.

It is a further object of the invention to provide a semiconductor device and a semiconductor module which can eliminate a production step of bonding a package body to a mother board which is to be conducted in order to prevent solder bonding portions from being broken.

In the semiconductor device of the embodiment, the device comprises: at least two substrates each of which has upper and lower faces, and which are placed so that end faces of the substrates are opposed to each other, thereby forming a space between the end faces; and a pair of integrated circuit packages each of which has a package body and plural leads that are drawn out from the package body, the packages being respectively disposed in upper and lower sides of the space, plural external connection terminals which are disposed on extended lines of the leads of the integrated circuit packages, and which are correspondingly connected to the plural leads are formed on the upper and lower faces of the substrates, the external connection terminals are configured by: first-group external connection terminals which are arranged on a side of the integrated circuit packages; and second-group external connection terminals which are arranged outside the first-group external connection terminals, the first-group external connection terminals and the second-group external connection terminals are arranged in a staggered pattern, and external connection bumps which are connected to the external connection terminals are disposed on at least one of the upper and lower faces of the substrates.

The device is configured so that an interval between adjacent terminals in first-group external connection terminals or second-group external connection terminals is twice an interval between corresponding leads of the integrated circuit packages.

The device is configured so that the external connection bumps have a diameter which is larger than a dimension of an interval between corresponding leads of the integrated circuit packages.

The device is configured so that dummy external connection terminals which are not connected to the integrated circuit packages are disposed on the substrates and outside end ones of the first-group external connection terminals and the second-group external connection terminals.

In a semiconductor module in which a semiconductor device is disposed on a mother board where a functional circuit is configured, the semiconductor device comprises: at least two substrates each of which has upper and lower faces, and which are placed so that end faces of the substrates are opposed to each other, thereby forming a space between the end faces; and a pair of integrated circuit packages each of which has a package body and plural leads that are drawn out from the package body, the packages being respectively disposed in upper and lower sides of the space, plural external connection terminals which are disposed on extended lines of the leads of the integrated circuit packages, and which are correspondingly connected to the plural leads are formed on the upper and lower faces of the substrates, the external connection terminals are configured by: first-group external connection terminals which are arranged on a side of the integrated circuit packages; and second-group external connection terminals which are arranged outside the first-group external connection terminals, the first-group external connection terminals and the second-group external connection terminals are arranged in a staggered pattern, external connection bumps which are connected to the external connection terminals are disposed on at least one of the upper and lower faces of the substrates, and the external connection bumps of the semiconductor device are connected to the mother board.

The module is configured so that one set of the external connection bumps is connected to first connection lands constituting the external connection terminals, another set of the external connection bumps is connected to second connection lands formed on the mother board, and a diameter of the first connection lands is equal to a diameter of the second connection lands.

The module is configured so that the semiconductor device is disposed on each of both the upper and lower faces of the mother board, the external connection bumps disposed on the semiconductor devices are connected to the mother board, and first positions where the external connection bumps on a side of the upper face are connected to the mother board are shifted from second positions where the external connection bumps on a side of the lower face are connected to the mother board.

The module is configured so that dummy external connection terminals which are not connected to the integrated circuit packages are disposed on the substrates and outside end ones of the first-group external connection terminals and the second-group external connection terminals, and external connection bumps which are connected to the dummy external connection terminals are disposed on at least one of the upper and lower faces of the substrates.

DETAILED DESCRIPTION OF THE PREFERRED EMBODIMENTS

Embodiment 1

Figure 1:
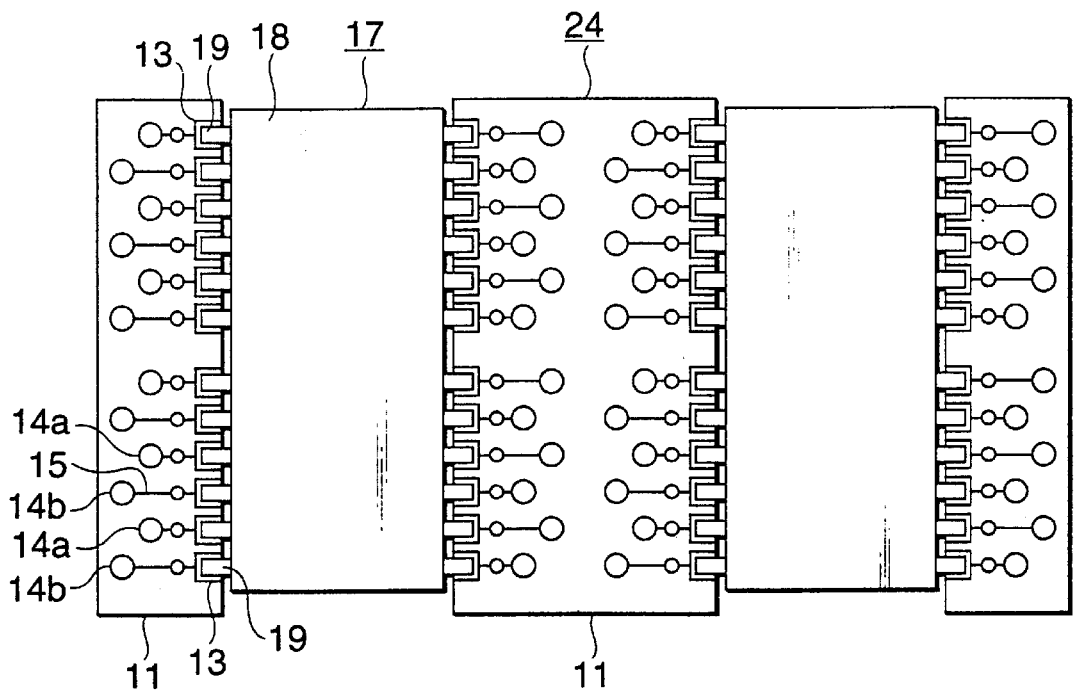
FIG. 1 is a plan view of a semiconductor device of Embodiment 1 of the invention.
Figure 2:
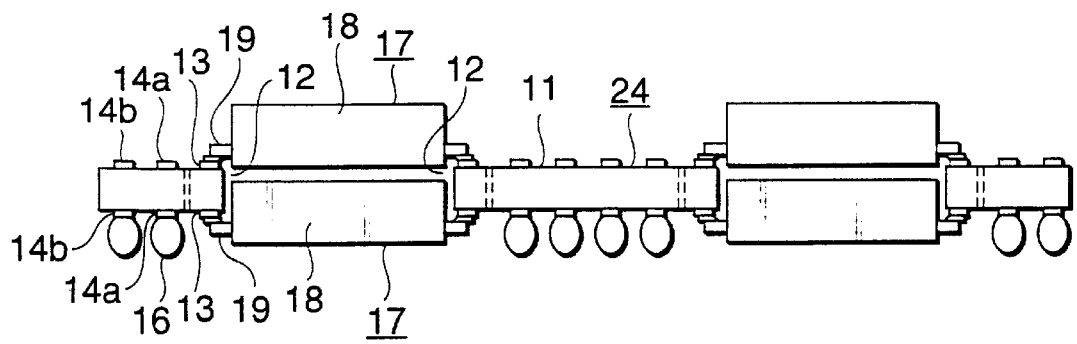
FIG. 2 is a side view of FIG. 1.

FIG. 1 is a plan view of a semiconductor device of Embodiment 1 of the invention, and FIG. 2 is a side view of FIG. 1. Referring to FIGS. 1 and 2, the semiconductor device 24 comprises at least two substrates 11 each of which has upper and lower faces. The substrates 11 are placed so that their end faces are opposed to each other. Openings 12 are disposed to form spaces between the end faces. A pair of IC packages 17 are disposed in each of the openings 12 so as to be respectively placed in the upper and loser side of the opening. Each of the IC packages 17 has a package body 18, and plural straight leads 19 which are laterally projected from the right and left side faces of the package body 18.

On upper and lower faces of the substrates 11 and in the peripheries of the openings 12, arranged are IC package mounting lands 13 which are to be correspondingly connected to the straight leads 19. Furthermore, external connection lands 14 serving as external connection terminals are arranged on the upper and lower faces of the substrates 11, and on extended lines of the straight leads 19, and correspondingly connected to the straight leads 19. The external connection lands are configured by: first-group external connection lands 14a which are arranged on the side of the integrated circuit packages 17; and second-group external connection lands 14b which are arranged outside the first-group external connection lands 14a. The first-group external connection lands 14a and the second-group external connection lands 14b are arranged in a staggered pattern. The interval between the lands, i.e., between the terminals in the first-group external connection lands 14a or the second-group external connection lands 14b is twice the interval between the straight leads 19.

In the IC package mounting lands 13 and the external connection lands 14a and 14b, each corresponding paired lands are electrically connected to each other via a wiring 15 formed on the substrate 11. With respect to the external connection lands 14a and 14b, each vertically corresponding paired lands which are respectively disposed on the upper and lower faces of the substrate 11 are electrically connected to each other via a conductor formed in a through hole that will be described later. The straight leads 19 are respectively fixed and electrically connected to the corresponding IC package mounting lands 13, whereby the leads are supported in the peripheries of the openings 12 by the substrate 11. In this way, a semiconductor device 24 is configured.

Figure 3:
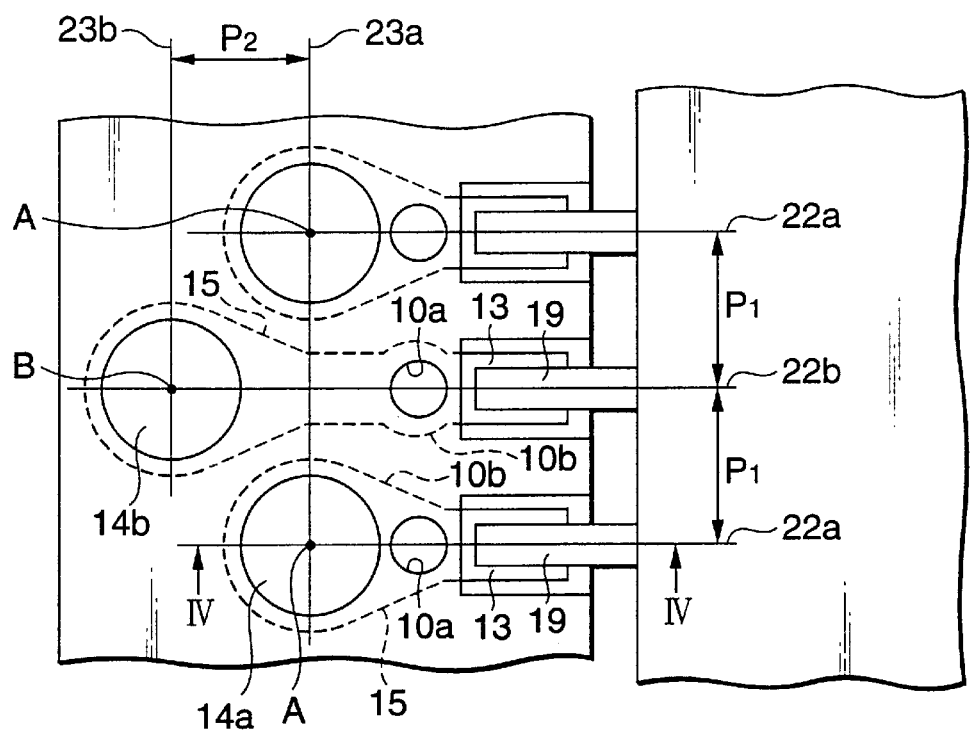
FIG. 3 is a view illustrating main portions of FIG. 1.
Figure 4:
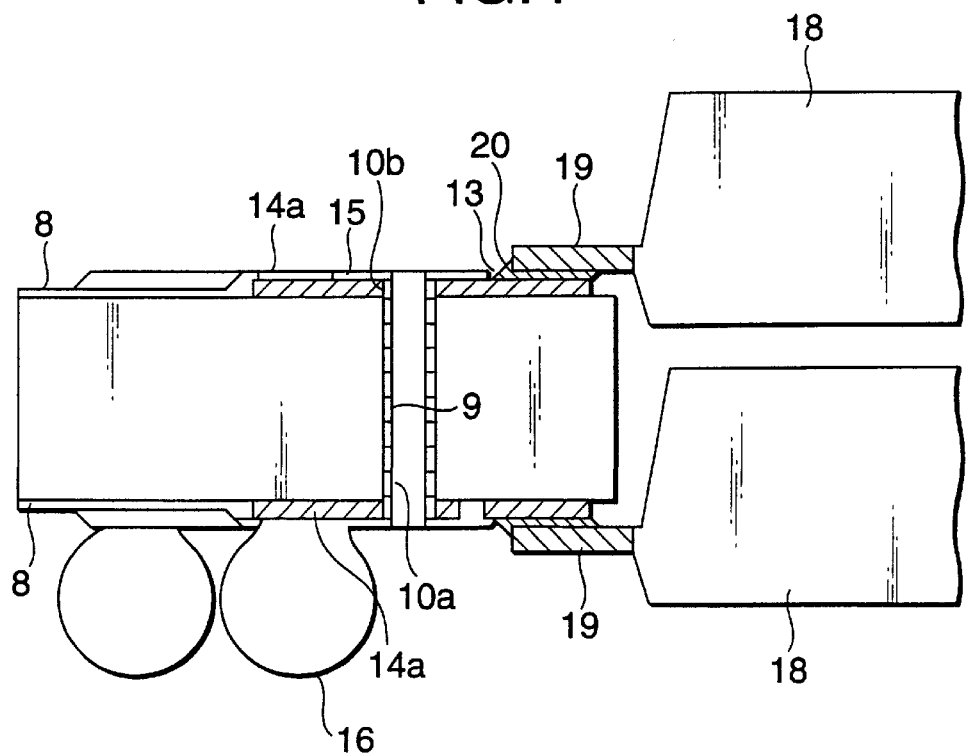
FIG. 4 is a section view taken along the line IV—IV of FIG. 3.

FIG. 3 is a view illustrating main portions of FIG. 1, and FIG. 4 is a section view taken along the line IV—IV of FIG. 3. Referring to FIGS. 3 and 4, in each of through hole lands 10b which are opposingly formed on the upper and lower faces of the substrate 11 and on the side faces of the IC package mounting lands 13, a through hole 10a which passes through the substrate 11 and the through hole lands 10b is formed. The paired lands which are respectively formed on the upper and lower faces of the substrate 11 and vertically correspond to each other are electrically connected to each other via a conductor member 9 which is formed on the inner wall face of the corresponding through hole 10a by plating of gold, silver, copper, palladium, solder, or the like.

The straight leads 19 which are laterally projected from the side faces of the package body 18 are connected to the external connection lands 14a and 14b which are to be correspondingly connected to the straight leads 19, via a bonding material 20 through which the IC package mounting lands 13 and the straight leads 19 are connected to one another and which are configured by solder or the like, the IC package mounting lands 13, the through hole lands 10b, and the wirings 15. As described above, among these components (the straight leads 19, the bonding material 20, the IC package mounting lands 13, the through hole lands 10b, the wirings 15, and the external connection lands 14a and 14b), each vertically corresponding paired components which are respectively disposed on the upper and lower faces of the substrate 11 are electrically connected to each other via the conductor member 9 of the through hole 10a.

The external connection lands 14a and 14b are arranged in a staggered pattern and respectively at intersections A and B of leader lines 22a and 22b of the straight leads 19 which are drawn out at intervals P1, and straight lines 23a and 23b which perpendicularly intersect with the lines and are separated from each other by an interval P2, i.e., the intersections A and B which are on the straight lines 23a and 23b and separated from each other by an interval of 2×P1.

The external connection lands 14a which are arranged on the line 23a are referred to as the first-group external connection electrodes, and the external connection lands 14b which are arranged on the line 23b are referred to as the second-group external connection electrodes.

A liquid insulating resin which is called a solder resist 8 is applied to the whole of the upper and lower faces of the substrate 11 except the through holes 10a, the IC package mounting lands 13, the external connection lands 14a and 14b, and the bonding material 20, so as to insulate the surface of the substrate. (In the external connection lands 14, there exist an outer peripheral portion which is covered with the solder resist 8, and portions which are not covered with the resist. The portions which are not covered with the solder resist 8 are referred to as the external connection lands 14a and 14b.)

The semiconductor device of Embodiment 1 is configured in the following procedure. First, the bonding material 20 is applied to the IC package mounting lands 13 on the upper face of the substrate 11 by using a solder print mask (not shown). Next, the package body 18 is placed in the opening 12 of the substrate 11, and an IC package 17 is placed on the bonding material 20 while making the straight leads 19 with the corresponding IC package mounting lands 13. Thereafter, the straight leads 19 are soldered to the IC package mounting lands 13 by using a reflow technique. Thereafter, the substrate 11 is turned over. Another IC package 17 is similarly soldered to the lower face of the substrate 11, and the solder bumps 16 are soldered to the external connection lands 14, thereby configuring the semiconductor device 24.

When the semiconductor device 24 of Embodiment 1 is employed in a usage other than a semiconductor module, the step of connecting the solder bumps 16 to the external connection lands 14 may be omitted.

Figure 5:
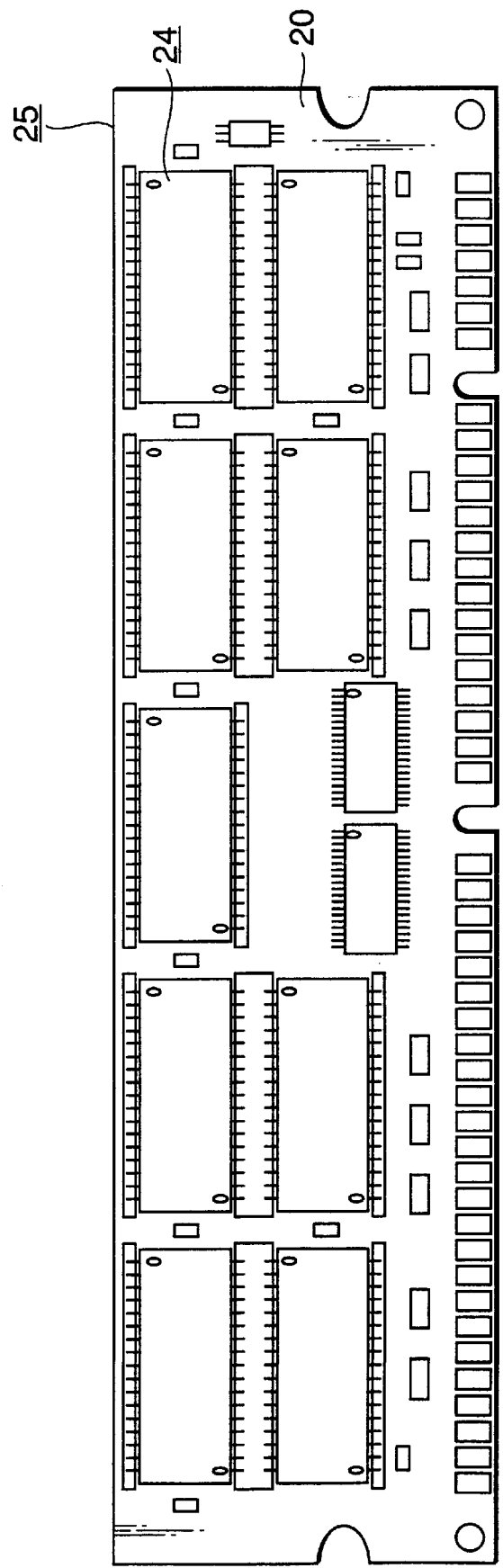
FIG. 5 is a plan view showing an example of a semiconductor module in which the semiconductor device of FIGS. 1 and 2 is soldered to a mother board.
Figure 6:
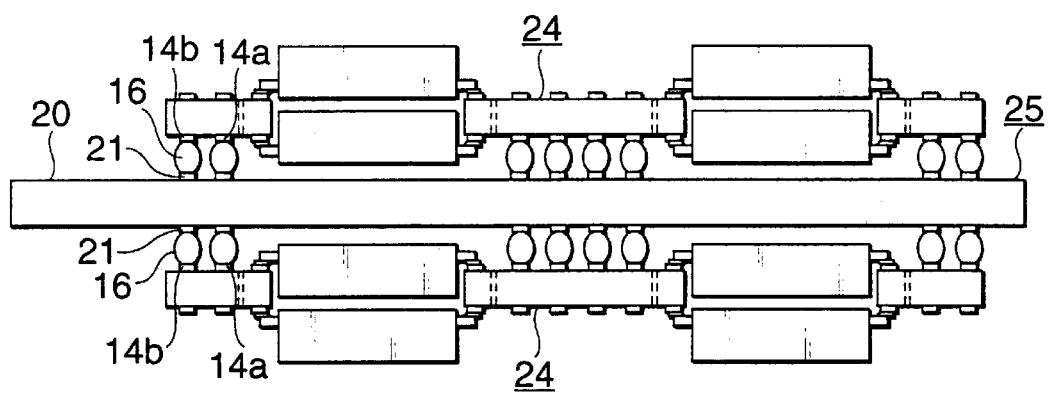
FIG. 6 is a side view of FIG. 5.

Next, the configuration of a semiconductor module will be described. FIG. 5 is a plan view showing an example of a semiconductor module in which the semiconductor device of FIGS. 1 and 2 is soldered to a mother board, and FIG. 6 is a side view of FIG. 5. Referring to FIGS. 5 and 6, connection lands 21 the dimension of which is equal to the diameter of the external connection lands 14 are disposed on the upper face of a mother board 20. The semiconductor devices 24 are electrically connected and mechanically fixed to the lands via the solder bumps 16. In this way, the semiconductor module 25 is configured.

When the external connection lands 14 are made equal in diameter to the connection lands 21, the sectional area of the bonding portions which determines the thermal fatigue strength of the bonding portions with respect to the external connection bumps is constant. Therefore, the bonding portions constituting the semiconductor module have no local weak part, so that the thermal fatigue life can be prolonged.

The semiconductor module 25 is connected and fixed to a mother board in the following procedure. First, the mother board 20 on which the connection lands 21 are disposed is prepared. Next, flux, solder paste, or the like is supplied to the connection lands 21 on the upper face of the mother board 20 by using a method such as the solder print mask method, the dispenser method, or the transfer method. The solder bumps 16 disposed on the semiconductor device 24 are placed on the supplied places, and the solder bumps 16 are soldered to the connection lands 21 by a reflow technique. Thereafter, the mother board 20 is turned over. On the lower face, similarly, the solder bumps 16 disposed on another semiconductor device 24 are soldered to the connection lands 21, thereby connecting and fixing the semiconductor module 25 to the mother board.

The flux or the solder paste which is supplied to the connection lands 21 on the lower face is smaller in amount than that which is supplied to the connection lands 21 on the upper face.

Figure 7:
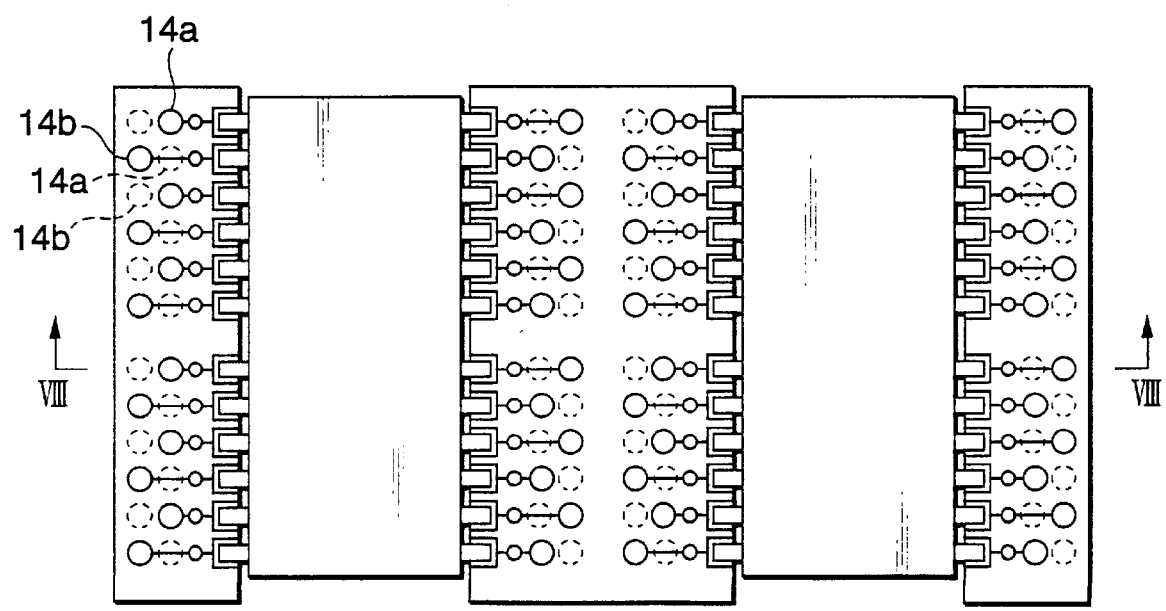
FIG. 7 is a plan view of a semiconductor module 25 shown in FIG. 6.
Figure 8:
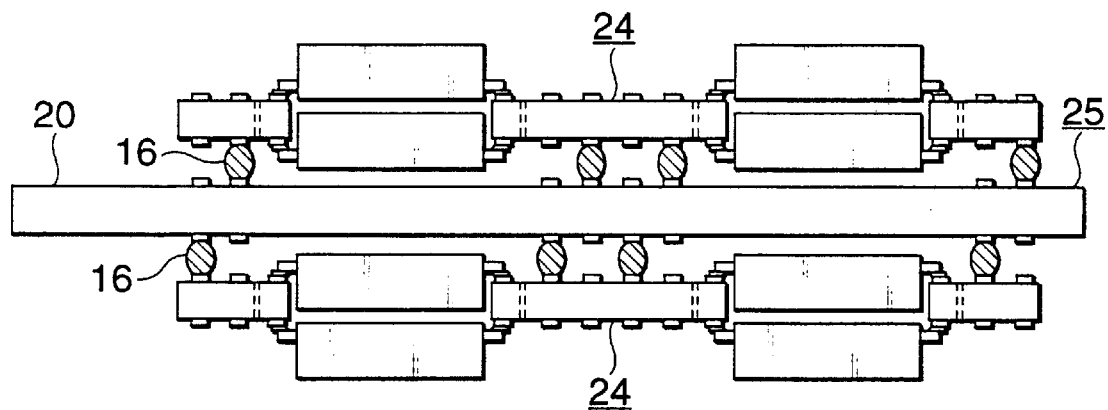
FIG. 8 is a section view taken along the line VIII—VIII of FIG. 7.

The thus produced semiconductor module 25 has the configuration shown in FIGS. 7 and 8. FIG. 7 is a plan view of the semiconductor module 25 shown in FIG. 6, and FIG. 8 is a section view taken along the line VIII—VIII of FIG. 7. The external connection bumps 14a and 14b disposed on the semiconductor devices 24 which are arranged on both the upper and lower faces of the mother board 20 are connected to the mother board 20. Positions (in FIG. 7, indicated by solid lines) where the external connection bumps 14a and 14b on the side of the upper face are connected to the mother board 20 are arranged so as to be shifted from those (in FIG. 7, indicated by broken lines) where the external connection bumps 14a and 14b on the side of the lower face are connected to the mother board 20. As a result, when the semiconductor device 24 shown in FIG. 1 is mounted on each of the faces of the mother board 20, for example, the devices are arranged while the positions indicated by the solid lines in FIG. 7 are shifted from those indicated by the broken lines.

In the semiconductor module 25 having the configuration of FIGS. 7 and 8, when the semiconductor devices 24 are soldered and fixed to the mother board 20 by a reflow technique, the second-group external electrodes 14b are arranged at positions of the lower face which are strictly opposed to those where the first-group external electrodes 14a are arranged on the upper face of the mother board 20, so that all the electrodes 14a and 14b are arranged with being shifted from one another while the electrodes on the upper and lower faces are not overlapped with one another. As described above, the solder bonding portions are distributedly arranged so that the portions on the upper and lower faces of the mother board 20 are not overlapped with one another, and hence it is possible to obtain a semiconductor module in which breakage due to thermal fatigue is prevented more surely from occurring.

Next, the interval P1 of the straight leads 19 shown in FIG. 3, the leader lines 22a and 22b of the straight leads 19 which are drawn out at the interval P1, and the interval P2 of the straight lines 23a and 23b which are perpendicular to the leader lines will be described. When the intervals P1 are equal to the interval P2, the interval between the center of each of the external connection lands 14a constituting the first-group external connection electrodes, and that of each of the external connection lands 14b constituting the second-group external connection electrodes can be elongated to 1.41 times the interval P1 or P2.

When the intervals of the centers of the external connection lands 14a and 14b is set to be twice the interval P1 of the straight leads 19, the intervals of the centers of the first-group external connection lands 14a and the second-group external connection lands 14b is reduced to 1.73 times the interval P1. Table 1 below shows an example of relationships in which the diameter of the solder bumps 16, the gap of the solder bumps 16, and the diameter of the external connection lands 14a and 14b are standardized.

TABLE 1

| lead pitch P1 mm | interval 1 2 × P1 mm | interval 2 1.73 × P1 mm | range of possible land diameter mm | range of possible bump diameter mm | range of possible bump gap mm |
|---|---|---|---|---|---|
| 1.27 | 2.54 | 2.20 | 0.6 or more | 0.75 or more | 1.79 or less |
| 1.00 | 2.00 | 1.73 | 0.6 or more | 0.75 or more | 1.25 or less |
| 0.80 | 1.60 | 1.39 | 0.6 or more | 0.75 or more | 0.85 or less |
| 0.65 | 1.30 | 1.13 | 0.6 | 0.75 | 0.55 |
| 0.50 | 1.00 | 0.87 | 0.5 | 0.60 | 0.40 |
| 0.40 | 0.80 | 0.69 | 0.4 | 0.45 | 0.35 |

Table 2 below shows an example of relationships in which the diameter of the solder bumps 16, the gap of the solder bumps 16, and the diameter of the external connection lands 14a and 14b are standardized in the case where the interval P2 is minimized without increasing the width of the substrate 11.

TABLE 2

| lead pitch P1 mm | interval 1 2 × P1 mm | requested interval 2 χ × P1 mm | range of possible land diameter mm | range of possible bump diameter mm | range of possible bump gap mm |
|---|---|---|---|---|---|
| 1.27 | 2.54 | 0.03 | 0.6 | 0.75 | 0.55 |
| 1.00 | 2.00 | 0.83 | 0.6 | 0.75 | 0.55 |
| 0.80 | 1.60 | 1.02 | 0.6 | 0.75 | 0.55 |
| 0.65 | 1.30 | 1.13 | 0.6 | 0.75 | 0.55 |
| 0.50 | 1.00 | 0.87 | 0.5 | 0.60 | 0.40 |
| 0.40 | 0.80 | 0.69 | 0.4 | 0.45 | 0.35 |

In Tables 1 and 2, the lead pitch indicates the interval of the straight leads 19 of the standard semiconductor package body 18. The interval 1 indicates the interval of adjacent external connection lands in the same group and is constant with respect to the interval P1 of the straight leads 19 or twice the interval. The interval 2 indicates the interval P2 and is varied as required. The land diameter indicates the diameter of the external connection lands 14a and 14b, the bump diameter indicates the diameter of the solder bumps 16, and the bump gap indicates the gap between adjacent solder bumps 16.

For reference purpose, Table 3 below shows an example of relationships in which the diameter of the solder bumps 16, the gap of the solder bumps 16, and the diameter of the external connection lands 14a and 14b are standardized in the case where the first-group external connection lands 14a and the second-group external connection lands 14b are arranged not in a staggered pattern as shown in FIG. 3 and the external connection lands, but in a row.

TABLE 3

| lead pitch P1 mm | interval 1 P1 mm | interval 2 mm | range of possible land diameter mm | range of possible bump diameter mm | range of possible bump gap mm |
|---|---|---|---|---|---|
| 1.27 | 1.27 | 0 | 0.6 | 0.75 | 0.52 |
| 1.00 | 1.00 | 0 | 0.5 | 0.60 | 0.40 |
| 0.80 | 0.80 | 0 | 0.4 | 0.45 | 0.35 |
| 0.65 | 0.65 | 0 | 0.3 | 0.40 | 0.25 |
| 0.50 | 0.50 | 0 | 0.2 | 0.30 | 0.25 |
| 0.40 | 0.40 | 0 | 0.15 | 0.20 | 0.20 |

In the case where the external connection lands are arranged in a row, when P1=0.4 mm, the bump gap is 0.2 mm as shown in Table 3, or only a gap which is one half of P1 is ensured. Also the bump diameter is 0.2 mm or one half of the interval P1 of the straight leads 19. In a TSOP (Thin Small Outline Package) type semiconductor package which is to be incorporated into an SRAM module and in which the thickness of the sealing resin is 1 mm, each lead has a thickness of 0.125 mm. The straight leads 19 are usually placed in a center area of the sealing resin. In the semiconductor package body 18, therefore, the dimensions of the sealing resin which is projected above the straight leads 19, and that which is projected below the straight leads are (1−0.125)/2=0.4375 mm.

In this case, when the diameter of the solder bumps 16 is 0.4375 mm or less, the outermost face of the semiconductor package body 18 abuts against the mother board 20, and a gap is formed between the solder bumps 16 and the mother board, with the result that the module cannot be mounted on the mother board. In other words, the IC package 17 in which the lead pitches respectively corresponding to the bump diameters of 0.4 mm, 0.3 mm, and 0.2 mm are respectively 0.65 mm, 0.5 mm, and 0.4 mm has a problem in that the IC package cannot be mounted on a mother board. In order to solve this problem, conventionally, a semiconductor package which is mounted on a mother board is restricted to one of the LOC (Lead On Chip) type in which the sealing resins of the semiconductor package body 18 that are respectively above and below the leads have different thicknesses as shown in FIG. 4.

In order to enable not only a LOC type semiconductor package but also all kinds of TSOP type semiconductor packages to be mounted on a memory module, in Embodiment 1 of the invention, the bump diameter is set to be larger than 0.4375 mm, or, for example, to 0.45 mm even when the lead pitch is minimum, as shown in Tables 1 and 2. It is empirically known that, when the minimum bump gap which can suppress a short circuit between bumps is set to be about 66% or more of the bump diameter, there arises no problem (In Tables 1 and 2, when the bump gap is set to be about 66% of the bump diameter or 0.4 mm, a short circuit between bumps can be prevented from occurring. When the minimum bump gap is set to be about 66% or more of the bump diameter, therefore, there arises no problem.). The case where the lead pitch is made fine or 0.40 mm in order to reduce the size of a semiconductor device will be considered. In the conventional method shown in Table 3, when the bump diameter is 0.2 mm, the bump gap is 0.2 mm. By contrast, in Embodiment 1 of the invention shown in Tables 1 and 2, the bump diameter can be ensured to be 0.45 mm which is larger than the lead pitch.

As described above, the diameter of the solder bumps 16 can be increased while ensuring the gap between adjacent solder bumps 16. Therefore, it is possible to prevent breakage due to thermal fatigue in the solder bonding portions between the solder bumps 16 and the external connection lands 14a and 14b from occurring, or to prevent breakage of the solder bonding portions due to thermal deformation from occurring, and to prevent a short circuit between solder bumps from occurring. Since the solder bonding portions are prevented from being broken, addition of a step of bonding the package body to the mother board can be eliminated.

When the external connection lands are arranged in a row, the bump diameter and the band gap are varied for each values of the lead pitch P1 as shown in Table 3, and hence solder bumps of six kinds of diameters are required. As seen from Table 1 or 2, when the first-external connection lands 14a and the second-external connection lands 14b are arranged in a staggered pattern as in the case of FIG. 3, the bump diameter of one kind or 0.75 mm can cope with the four kinds of lead pitches P1 of 0.65 to 1.27 mm. Therefore, it is required to prepare only solder bumps of three kinds or 0.45 mm, 0.6 mm, and 0.75 mm, and the production management is facilitated. It is a matter of course that, in some cases, the bump diameters can be unified to one kind of 0.45 mm for all kinds of semiconductor packages in which the lead pitch ranges from 0.4 mm to 1.27 mm.

In the above, straight leads are used as the leads which are laterally drawn out from the package body. Alternatively, bent leads may be used with attaining the same effects as those described above.

The method of mounting one stage of semiconductor devices on each of upper and lower faces of a mother board has been described. When solder bumps are connected to remaining external connection lands, it is possible to mount two stages of semiconductor devices on each of upper and lower faces of a mother board. Also in this case, the same effects as those described above can be attained.

Alternatively, semiconductor devices may be mounted only on one face of a mother board with attaining the same effects as those described above. In the alternative, mounting is not required to be performed on the back face of the mother board, and hence the numbers of production steps and semiconductor devices can be reduced, so that a more economical semiconductor module can be obtained.

Embodiment 2

Figure 9:
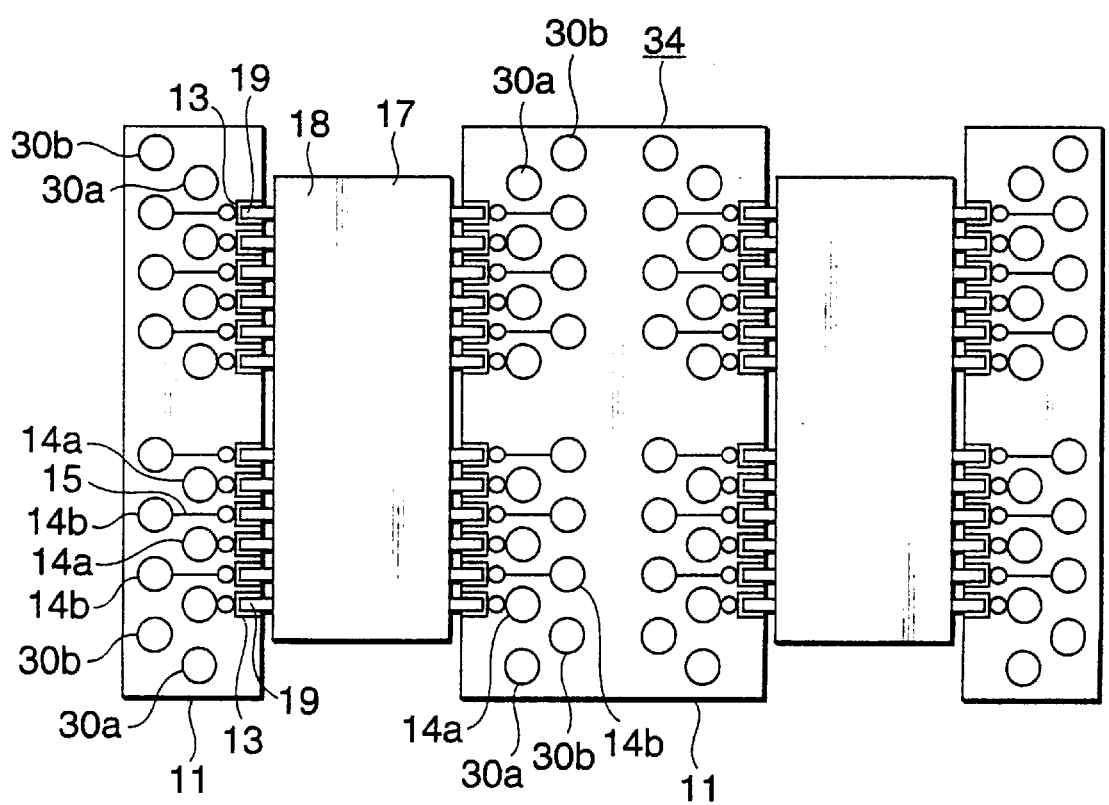
FIG. 9 is a plan view of a semiconductor device of Embodiment 2 of the invention.
Figure 10:
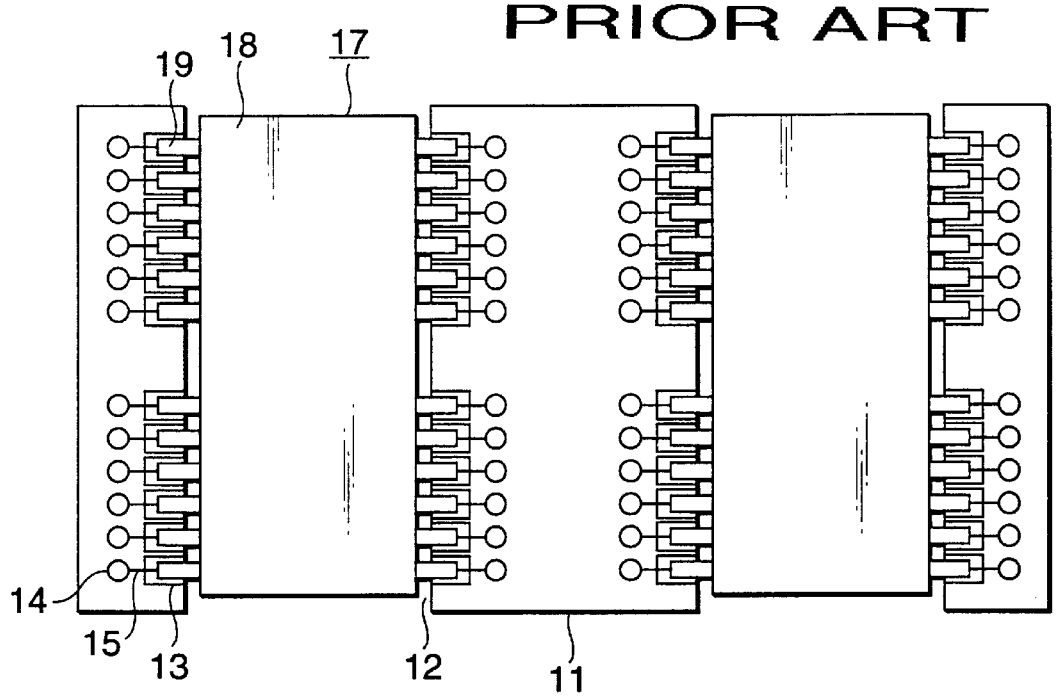
FIG. 10 is a plan view showing the configuration of a semiconductor device of the conventional art.
Figure 11:
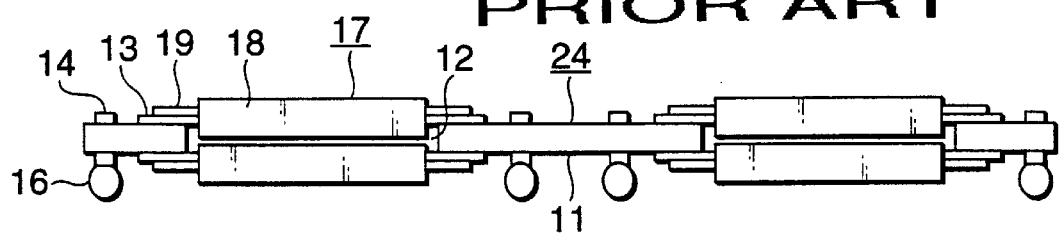
FIG. 11 is a side view of FIG. 10.
Figure 12:
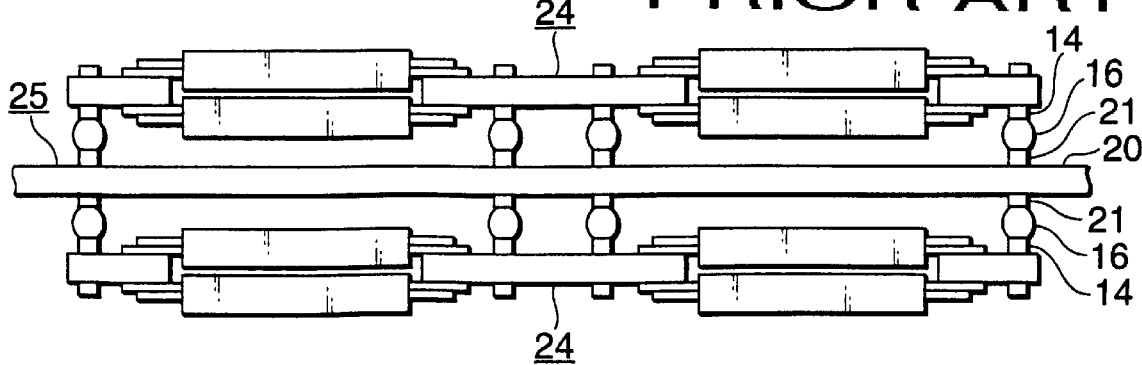
FIG. 12 is a side view showing the configuration of a semiconductor module of the conventional art in which the semiconductor device of FIGS. 10 and 11 is soldered to a mother board.
Figure 13:
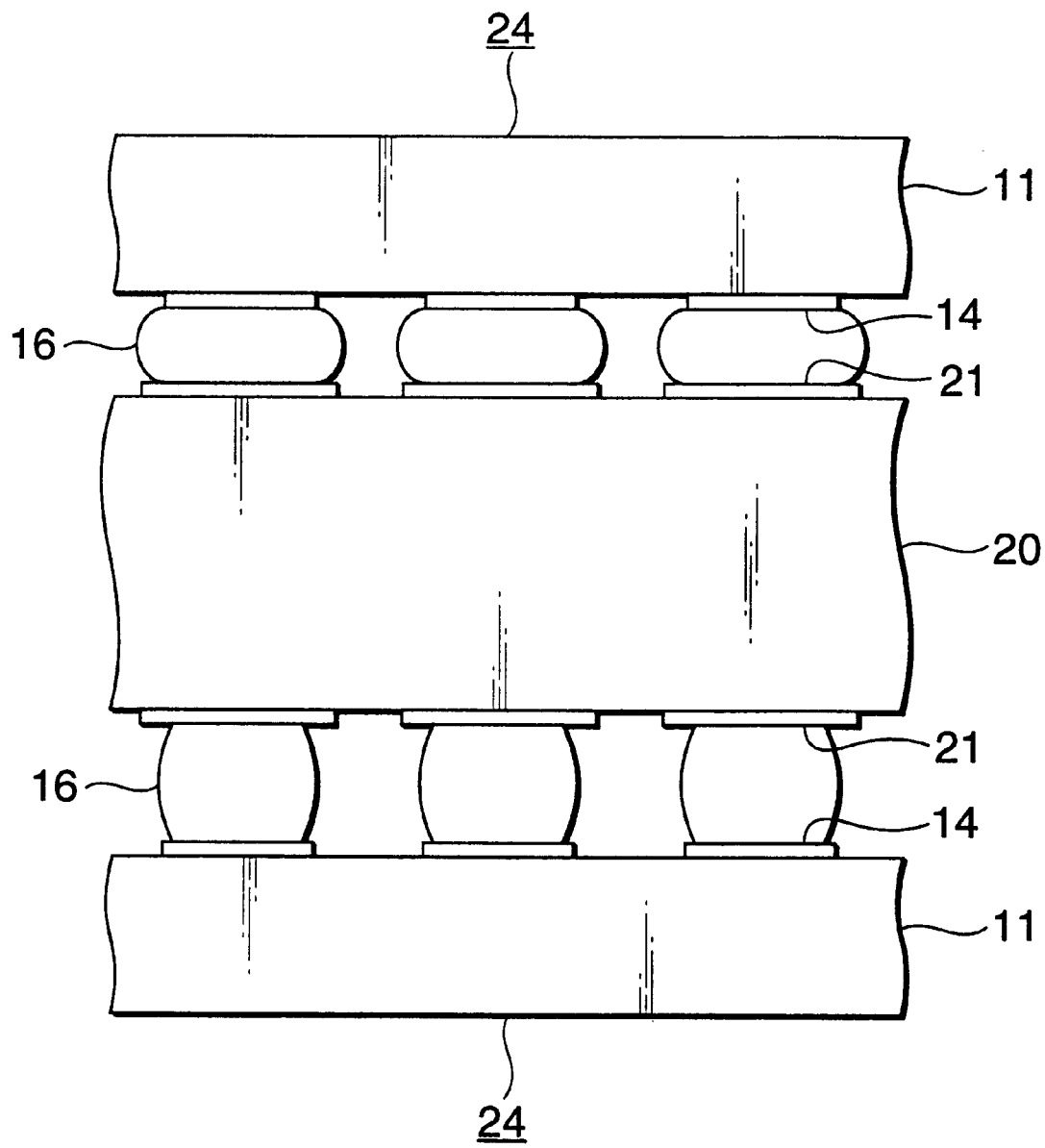
FIG. 13 is a diagram showing a section where semiconductor devices and a mother board which have undergone a temperature cyclic test are bonded to each other via solder bumps and lands.
Figure 14A:
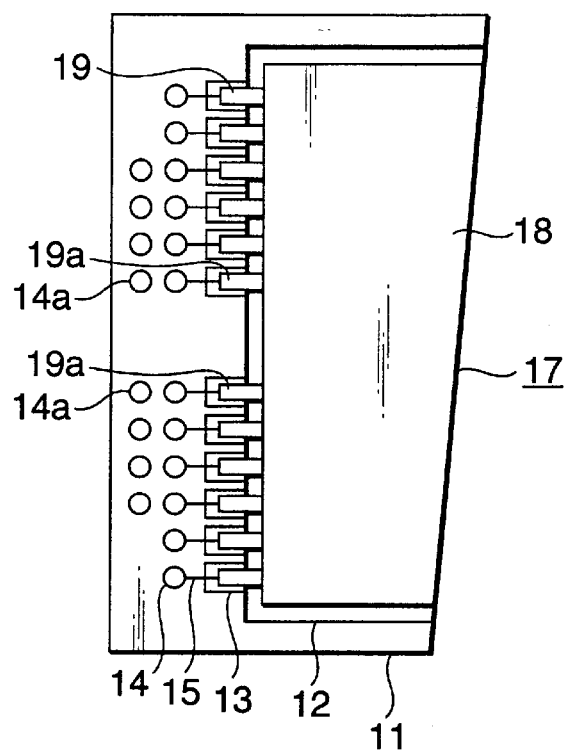
FIGS. 14A and 14B are plan views showing the configuration of another semiconductor device of the conventional art.
Figure 14B:
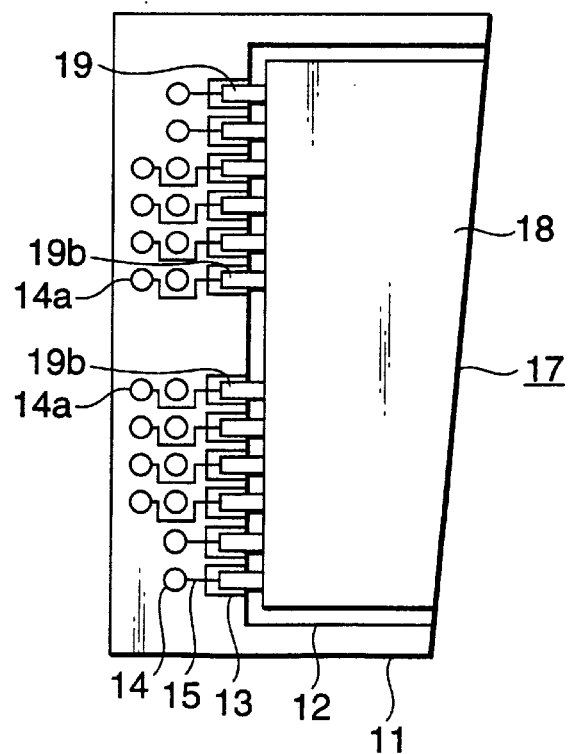

FIG. 9 is a plan view of a semiconductor device of Embodiment 2 of the invention. In FIG. 9, the same reference numerals denote components identical or equivalent to those of FIG. 1, and description of such components is omitted. Dummy external connection terminals 30a and 30b which are not connected to the straight leads 19 of the integrated circuit packages are disposed on the substrates 11, outside the end ones of the external connection lands 14a serving as the first-group external connection terminals, and the external connection lands 14b serving as the second-group external connection terminals, and on extended lines of the first-group external connection lands 14a and the second-group external connection lands 14b. In this way, a semiconductor device 34 is configured.

According to the semiconductor device 34, the length in which the solder bonding portions of the dummy external connection terminals 30a and 30b are fixed by soldering can be made longest. In Embodiment 1, therefore, the greatest thermal deformation occurs in the solder bonding portions in the external connection lands 14a and 14b at the ends where the length of solder fixation is longest. When breakage occurs, the end solder bonding portions are early broken. According to the embodiment, such a phenomenon can be prevented from occurring.

In the semiconductor device 34, in the same manner as Embodiment 1, the solder bumps 16 connected to the external connection lands 14a and 14b and also to the dummy external connection terminals 30a and 30b are electrically connected and mechanically fixed to the connection lands 21 disposed on the mother board 20. In this way, the semiconductor module is configured.

According to the semiconductor module of Embodiment 2, in the dummy external connection terminals 30a and 30b, the length in which the solder bonding portions are fixed by soldering is longest. When breakage due to thermal deformation occurs, therefore, the solder bonding portions in the dummy external connection terminals 30a and 30b at the ends are early broken. Consequently, it is possible to prevent the solder bonding portions in the external connection lands 14a and 14b at the ends from being broken.

The invention is configured as described above, and hence attains the following effects.

The semiconductor device comprises: at least two substrates each of which has upper and lower faces, and which are placed so that end faces of the substrates are opposed to each other, thereby forming a space between the end faces; and a pair of integrated circuit packages each of which has a package body and plural leads that are drawn out from the package body, the packages being respectively disposed in upper and lower sides of the space, plural external connection terminals which are disposed on extended lines of the leads of the integrated circuit packages, and which are correspondingly connected to the plural leads are formed on the upper and lower faces of the substrates, the external connection terminals are configured by: first-group external connection terminals which are arranged on a side of the integrated circuit packages; and second-group external connection terminals which are arranged outside the first-group external connection terminals, the first-group external connection terminals and the second-group external connection terminals are arranged in a staggered pattern, and external connection bumps which are connected to the external connection terminals are disposed on at least one of the upper and lower faces of the substrates. Therefore, the diameter of the external connection bumps can be increased while ensuring the gap between adjacent external connection terminals. Consequently, it is possible to prevent breakage due to thermal fatigue in the solder bonding portions between the external connection terminals and the external connection lands from occurring. Furthermore, the external connection lands can be prevented from being short-circuited.

An interval between adjacent terminals in first-group external connection terminals or second-group external connection terminals is twice an interval between corresponding leads of the integrated circuit packages. Therefore, the gap between the external connection bumps connected to the external connection terminals can be set to be large, and the diameter of the external connection bumps can be made larger.

The external connection bumps have a diameter which is larger than a dimension of an interval between corresponding leads of the integrated circuit packages. Therefore, it is possible to prevent breakage due to thermal fatigue in the solder bonding portions between the external connection terminals and the external connection bumps from occurring.

Dummy external connection terminals which are not connected to the integrated circuit packages are disposed on the substrates and outside end ones of the first-group external connection terminals and the second-group external connection terminals. In the solder bonding portions of the dummy external connection terminals, therefore, the length of solder fixation can be made longest. Consequently, it is possible to prevent the greatest thermal deformation from occurring in the solder bonding portions of the end terminals of the first-group external connection terminals and the second-group external connection terminals.

The semiconductor module in which a semiconductor device is disposed on a mother board where a functional circuit is configured comprises: at least two substrates each of which has upper and lower faces, and which are placed so that end faces of the substrates are opposed to each other, thereby forming a space between the end faces; and a pair of integrated circuit packages each of which has a package body and plural leads that are drawn out from the package body, the packages being respectively disposed in upper and lower sides of the space, plural external connection terminals which are disposed on extended lines of the leads of the integrated circuit packages, and which are correspondingly connected to the plural leads are formed on the upper and lower faces of the substrates, the external connection terminals are configured by: first-group external connection terminals which are arranged on a side of the integrated circuit packages; and second-group external connection terminals which are arranged outside the first-group external connection terminals, the first-group external connection terminals and second-group external connection terminals are arranged in a staggered pattern, external connection bumps which are connected to the external connection terminals are disposed on at least one of the upper and lower faces of the substrates, and the external connection bumps of the semiconductor device are connected to the mother board. Therefore, the diameter of the external connection bumps can be increased while ensuring the gap between adjacent external connection terminals. Consequently, it is possible to prevent breakage due to thermal fatigue in the solder bonding portions between the external connection terminals and the external connection lands from occurring. Furthermore, the external connection lands can be prevented from being short-circuited.

One set of the external connection bumps is connected to first connection lands constituting the external connection terminals, another set of the external connection bumps is connected to second connection lands formed on the mother board, and a diameter of the first connection lands is equal to a diameter of the second connection lands. Therefore, the sectional area of the bonding portions which determines the thermal fatigue strength of the bonding portions with respect to the external connection bumps is constant. As a result, the bonding portions constituting the semiconductor module have no local weak part, so that the thermal fatigue life can be prolonged.

The semiconductor device is disposed on each of both the upper and lower faces of the mother board, the external connection bumps disposed on the semiconductor devices are connected to the mother board, and first positions where the external connection bumps on a side of the upper face are connected to the mother board are shifted from second positions where the external connection bumps on a side of the lower face are connected to the mother board. Therefore, the solder bonding portions are distributedly arranged so that the portions on the upper and lower faces of the mother board are not overlapped with one another, and hence breakage due to thermal fatigue can be further suppressed.

Dummy external connection terminals which are not connected to the integrated circuit packages are disposed on the substrates and outside end ones of the first-group external connection terminals and the second-group external connection terminals, and external connection bumps which are connected to the dummy external connection terminals are disposed on at least one of the upper and lower faces of the substrates. In the solder bonding portions of the dummy external connection terminals, therefore, the length of solder fixation can be made longest. Consequently, it is possible to prevent the greatest thermal deformation from occurring in the solder bonding portions of the end terminals of the first-group external connection terminals and the second-group external connection terminals.

What is claimed is:

1. A semiconductor device comprising:
   at least two substrates, each substrate having upper, lower, and end faces, said upper and lower faces being opposed to each other and said end faces being transverse to said upper and lower faces, said two substrates being spaced apart so that said end faces of said substrates are opposed to and spaced from each other by a space between said end faces;
   first and second integrated circuit packages, each of said first and second integrated circuit packages having a package body and plural leads extending from said package body, said first and second integrated circuit packages being respectively disposed in the space, said first integrated circuit package protruding from the space toward said upper faces of said substrates and said second integrated circuit package protruding from the space toward said lower faces of said substrates;
   plural external connection terminals located on said upper and lower faces of said substrates, said external connection terminals including
      a first group of external connection terminals located along sides of said first and second integrated circuit packages, centers of each pair of adjacent connection terminals of said first group of external connection terminals being separated by an interval 2P1; and
      a second group of external connection terminals located along sides of said first and second integrated circuit packages and farther from said first and second integrated circuit packages than said first group of external connection terminals, centers of each pair of adjacent connection terminals of said second group of external connection terminals being separated by the interval 2P1, centers of each pair of adjacent connection terminals of the first and second groups of external connection terminals being separated by an interval 1.41P1, external connection terminals of said first group of external connection terminals and of said second group of external connection terminals being arranged in an alternating, staggered pattern with alternating leads of said first and second integrated circuit packages respectively connected to the external terminals of said first group of external connection terminals, and alternating leads of said first and second integrated circuit packages not connected to said first group of external terminals being respectively connected to said external terminals of said second group of external connection terminals; and
   external connection bumps connected to said external connection terminals and disposed on at least one of said upper and lower faces of said substrates, wherein each of said external connection terminals is directly opposite a corresponding lead of said first and second integrated circuit packages to which the respective external connection terminal is electrically connected.

2. The semiconductor device according to claim 1, wherein an interval between adjacent terminals of said first-group of external connection terminals and adjacent terminals of said second group of external connection terminals is twice an interval between adjacent leads of said first and second integrated circuit packages.

3. The semiconductor device according to claim 1, wherein said external connection bumps have a diameter larger than an interval between corresponding leads of said first and second integrated circuit packages.

4. The semiconductor device according to claim 1, including dummy external connection terminals not connected to said first and second integrated circuit packages, disposed on said substrates, and outside ends of said first group of external connection terminals and said second group of external connection terminals.

5. A semiconductor module including:

a mother board on which a functional circuit is located, said mother board having upper and lower faces; and first and second semiconductor devices respectively disposed on said upper and lower faces of said mother board, each of said first and second semiconductor devices comprising at least two substrates, each substrate having upper, lower, and end faces, said upper and lower faces being opposed to each other and said end faces being transverse to said upper and lower faces, said two substrates being spaced apart so that said end faces of said substrates are opposed to and spaced from each other by a space between said end faces;

first and second integrated circuit packages, each of said first and second integrated circuit packages having a package body and plural leads extending from said package body, said first and second integrated circuit packages being respectively disposed in the space, said first integrated circuit package protruding from the space toward said upper faces of said substrates and said second integrated circuit package protruding from the space toward said lower faces of said substrates;

plural external connection terminals located on said upper and lower faces of said substrates, said external connection terminals including a first group of external connection terminals located along sides of said first and second integrated circuit packages, centers of each pair of adjacent connection terminals of said first group of external connection terminals being separated by an interval 2P1; and a second group of external connection terminals located along sides of said first and second integrated circuit packages and farther from said first and second integrated circuit packages than said first group of external connection terminals, centers of each pair of adjacent connection terminals of said second group of external connection terminals being separated by an interval P1, centers of each pair of adjacent connection terminals of the first and second groups of external connection terminals being separated by an interval 1.73P1, external connection terminals of said first group of external connection terminals and of said second-group of external connection terminals being arranged in an alternating, staggered pattern with alternating leads of said first and second integrated circuit packages respectively connected to the external terminals of said first group of external connection terminals, and alternating leads of said first and second integrated circuit packages not connected to said first group of external terminals being respectively connected to said external terminals of said second group of external connection terminals; and external connection bumps connected to said external connection terminals and disposed on at least one of said upper and lower faces of said substrates, wherein said external connection bumps of said semiconductor device are connected to said mother board, and first positions where said external connection bumps on said upper face of said mother board are connected to said mother board are shifted from second positions where said external connection bumps on said lower face of said mother board are connected to said mother board.

6. The semiconductor module according to claim 5, wherein said external connection terminals include first connection lands and some of said external connection bumps are connected to said first connection lands;

said mother board includes second connection lands and some of said external connection bumps are connected to said second connection lands; and said first and second connection lands have equal diameters.

7. The semiconductor module according to claim 5, including dummy external connection terminals not connected to said first and second integrated circuit packages, disposed on said substrates, and outside ends of said first group of external connection terminals and said second group of external connection terminals, and wherein said external connection bumps connected to said dummy external connection terminals are disposed on at least one of said upper and lower faces of said substrates.

* * * * *